United States Patent
Choo et al.

(10) Patent No.: US 7,741,690 B2
(45) Date of Patent: Jun. 22, 2010

(54) PHOTOELECTRIC CONVERSION DEVICE AND PHOTODETECTOR APPARATUS HAVING THE SAME

(75) Inventors: Dae-Ho Choo, Yongin-si (KR); Dong-Cheol Kim, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 12/258,838

(22) Filed: Oct. 27, 2008

(65) Prior Publication Data

US 2009/0114916 A1 May 7, 2009

(30) Foreign Application Priority Data

Oct. 31, 2007 (KR) .................. 10-2007-0110342

(51) Int. Cl.
*H01L 31/00* (2006.01)
(52) U.S. Cl. ............... 257/458; 257/459; 257/E31.047; 257/E31.061
(58) Field of Classification Search .......... 257/458, 257/459, E31.047, E31.061
See application file for complete search history.

(56) References Cited

U.S. PATENT DOCUMENTS

| 5,262,649 | A | 11/1993 | Antonuk et al. |
| 5,401,330 | A * | 3/1995 | Saito et al. .................. 136/259 |
| 5,596,198 | A | 1/1997 | Perez-Mendez |
| 7,038,238 | B1 * | 5/2006 | Yamazaki ..................... 257/53 |
| 7,332,226 | B2 * | 2/2008 | Fujisawa et al. ............ 428/432 |
| 2007/0181904 | A1 * | 8/2007 | Yanagita et al. ............. 257/103 |
| 2009/0047752 | A1 * | 2/2009 | Yamazaki et al. ............. 438/96 |
| 2009/0152607 | A1 * | 6/2009 | Tanaka et al. ............... 257/295 |
| 2009/0223562 | A1 * | 9/2009 | Niira et al. ................... 136/256 |

FOREIGN PATENT DOCUMENTS

| JP | 01126583 | 5/1989 |
| JP | 2006093422 | 4/2006 |

\* cited by examiner

*Primary Examiner*—Ngan Ngo
(74) *Attorney, Agent, or Firm*—Cantor Colburn LLP

(57) ABSTRACT

A photoelectric conversion device includes an intrinsic semiconductor layer, a first conductive type semiconductor layer disposed on a first side of the intrinsic semiconductor layer, and a second conductive type semiconductor layer disposed on a second side of the intrinsic semiconductor layer opposite the first side. The intrinsic semiconductor layer includes an amorphous semiconductor layer and a crystalline semiconductor layer including a plurality of crystals. A diameter of a crystal of the plurality of crystals is equal to or less than approximately 100 angstroms.

24 Claims, 8 Drawing Sheets

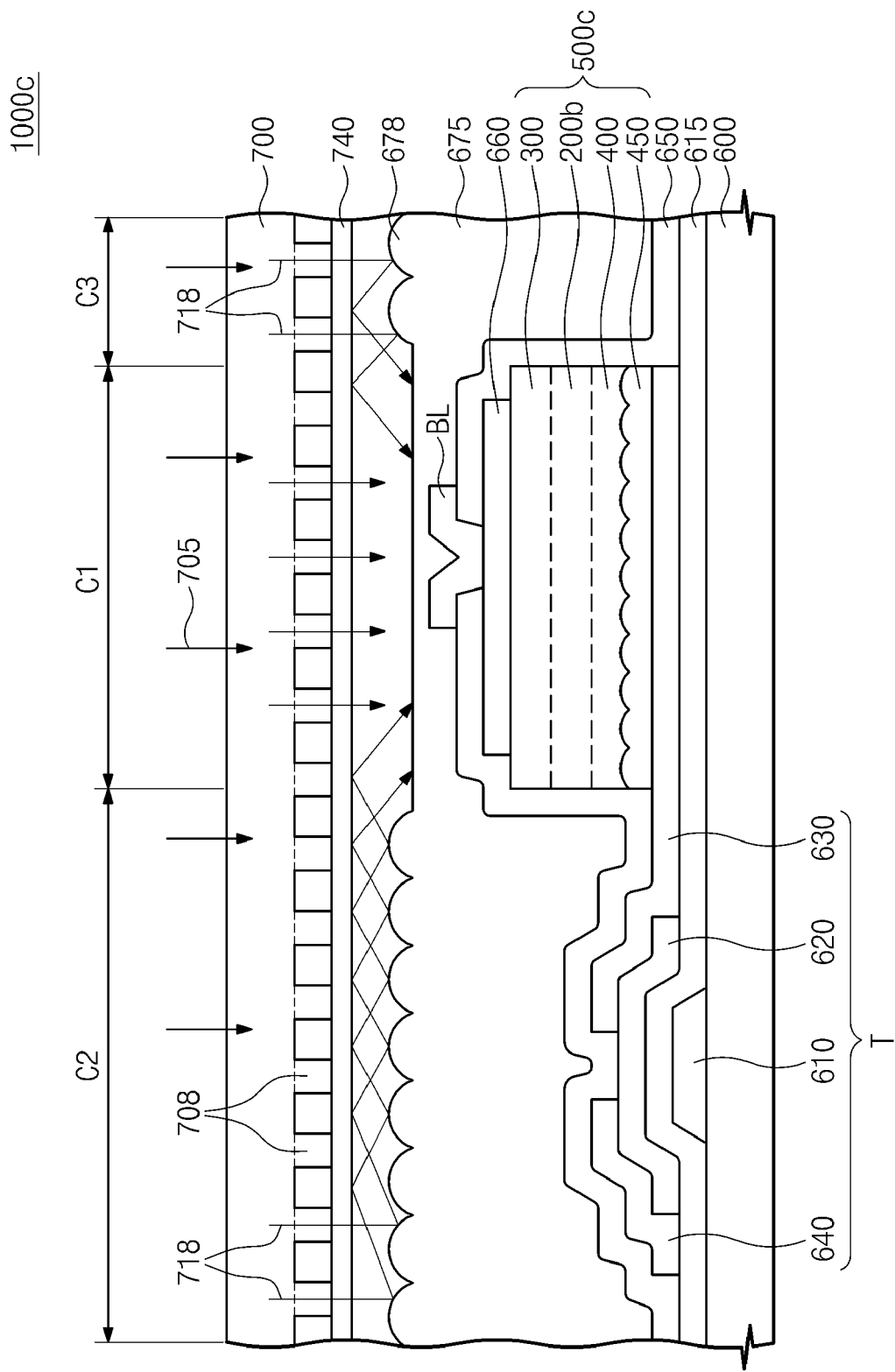

US 7,741,690 B2

PHOTOELECTRIC CONVERSION DEVICE AND PHOTODETECTOR APPARATUS HAVING THE SAME

This application claims priority to Korean Patent Application No. 2007-110342, filed on Oct. 31, 2007, and all the benefits accruing therefrom under 35 U.S.C. § 119, the contents of which in its entirety are herein incorporated by reference.

BACKGROUND OF THE INVENTION

1. Field of the Invention

The present invention relates to a photoelectric conversion device and a photodetector apparatus having the photoelectric conversion device. More particularly, the present invention relates to a photoelectric conversion device having improved photoelectric conversion efficiency and a photodetector apparatus having the same.

2. Description of the Related Art

A photoelectric conversion device includes a semiconductor layer which absorbs light energy and thereafter performs a photoelectric conversion process to thereby convert the light energy into electrical energy. An efficiency of the photoelectric conversion process of the photoelectric conversion device is a function of an amount of current generated by the photoelectric conversion device as compared to an amount of light applied to the photoelectric conversion device.

A photodetector apparatus includes a plurality of the photoelectric conversion devices, each of which outputs an electrical signal corresponding to light applied thereto, and the photodetector apparatus uses the electrical signal from each of the photoelectric conversion devices to measure an amount of the light. When the photodetector apparatus is used as a medical diagnostic apparatus, for example, the photodetector apparatus typically further includes a scintillator array which converts an x-ray to a light having a wavelength which corresponds to a visible light.

A photodetecting efficiency of the photodetector apparatus depends on a light-conversion efficiency of the scintillator array and a photoelectric conversion efficiency of the photoelectric conversion device. Further, the photoelectric conversion efficiency of the photoelectric conversion device is determined based on both a light-absorbing efficiency and a light-conversion efficiency of the photoelectric conversion device.

BRIEF SUMMARY OF THE INVENTION

An exemplary embodiment of the present invention provides a photoelectric conversion device having improved photoelectric conversion efficiency, and a photodetector apparatus having the photoelectric conversion device.

In an exemplary embodiment of the present invention, a photoelectric conversion device includes an intrinsic semiconductor layer, a first conductive type semiconductor layer disposed on a first side of the intrinsic semiconductor layer, and a second conductive type semiconductor layer disposed on a second side of the intrinsic semiconductor layer opposite the first side.

The intrinsic semiconductor layer includes an amorphous semiconductor layer and a crystalline semiconductor layer including a plurality of crystals. A diameter of a crystal of the plurality of crystals is equal to or less than approximately 100 angstroms.

A thickness of the amorphous semiconductor layer is equal to or less than approximately 1 micrometer.

The first conductive type semiconductor layer includes a p-type semiconductor layer, and the second conductive type semiconductor layer includes an n-type semiconductor layer.

In an alternative exemplary embodiment of the present invention, a photodetector apparatus includes a base substrate, a photoelectric conversion device disposed on the base substrate, a bias line disposed on the base substrate and electrically connected to the photoelectric conversion device to apply a bias signal to the photoelectric conversion device, and a signal line disposed on the base substrate to output a current from the photoelectric conversion device.

The intrinsic semiconductor layer includes an intrinsic semiconductor layer including an amorphous semiconductor layer and a crystalline semiconductor layer including a plurality of crystals, each crystal of the plurality of crystals having a diameter equal to or less than approximately 100 angstroms. The intrinsic semiconductor layer further includes a first conductive type semiconductor layer disposed on a first surface of the intrinsic semiconductor layer, and a second conductive type semiconductor layer disposed on a second opposite surface of the intrinsic semiconductor layer.

The photoelectric conversion device receives a light from an external source, the light causes a photoelectric conversion reaction in the photoelectric conversion device, and the photoelectric conversion device outputs the current based on the photoelectric conversion reaction and the bias signal.

BRIEF DESCRIPTION OF THE DRAWINGS

The above and other aspects, features and advantages of the present invention will become more readily apparent by describing in further detail exemplary embodiments thereof with reference to the accompanying drawings, in which:

FIG. 8 is a partial cross-sectional view of a photodetector apparatus according to still another alternative exemplary embodiment of the present invention.

DETAILED DESCRIPTION OF THE INVENTION

Figure 1:
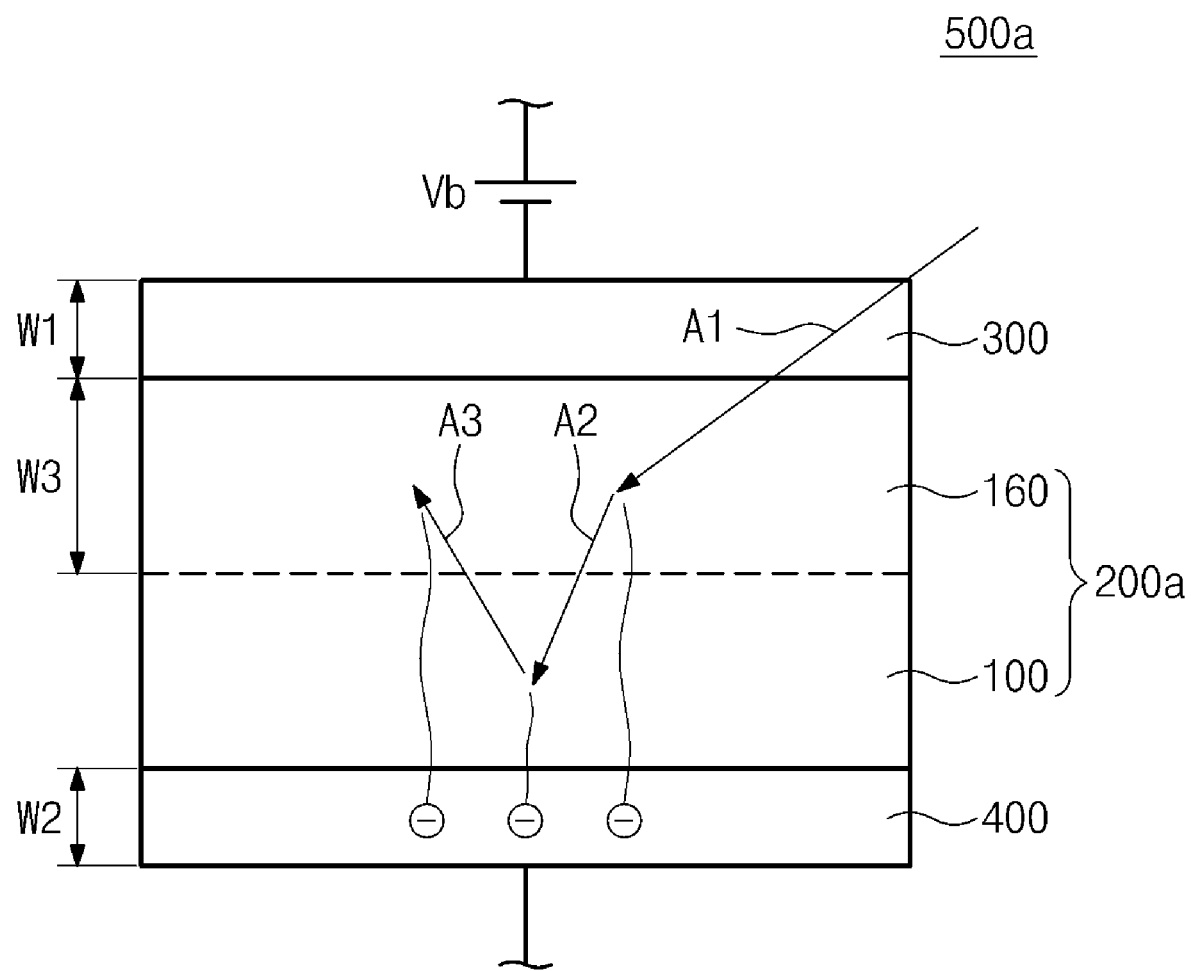
FIG. 1 is a partial cross-sectional equivalent schematic view of a photoelectric conversion device according to an exemplary embodiment of the present invention.

The invention will now be described more fully hereinafter with reference to the accompanying drawings, in which exemplary embodiments of the invention are shown. The present invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including," when used in this specification, specify the presence of stated features, regions, integers, steps, operations, elements and/or components, but do not preclude the presence or addition of one or more other features, regions, integers, steps, operations, elements, components and/or groups thereof.

Furthermore, relative terms, such as "lower" or "bottom" and "upper" or "top" may be used herein to describe one element's relationship to other elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on the "upper" side of the other elements. The exemplary term "lower" can, therefore, encompass both an orientation of "lower" and "upper," depending upon the particular orientation of the figure. Similarly, if the device in one of the figures were turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning which is consistent with their meaning in the context of the relevant art and the present disclosure, and will not be interpreted in an idealized or overly formal sense unless expressly so defined herein.

Exemplary embodiments of the present invention are described herein with reference to cross section illustrations which are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes which result, for example, from manufacturing. For example, a region illustrated or described as flat may, typically, have rough and/or nonlinear features. Moreover, sharp angles which are illustrated may be rounded. Thus, the regions illustrated in the figures are schematic in nature and their shapes are not intended to illustrate the precise shape of a region and are not intended to limit the scope of the present invention.

Hereinafter, exemplary embodiments of the present invention will be explained in further detail with reference to the accompanying drawings.

FIG. 1 is a partial cross-sectional equivalent schematic view of a photoelectric conversion device according to an exemplary embodiment of the present invention. In an exemplary embodiment, the photoelectric conversion device is a photodiode. For purposes of description herein, the photodiode will be described as a representative photoelectric conversion device, but it will be understood that alternative exemplary embodiments are not limited thereto.

Referring to FIG. 1, a photodiode 500a includes an intrinsic semiconductor layer 200a, a p-type silicon layer 300, and an n-type silicon layer 400. The p-type silicon layer 300 and the n-type silicon layer 400 are disposed on substantially opposite surfaces of the intrinsic semiconductor layer 200a, e.g., to face each other while including the intrinsic semiconductor layer 200a interposed therebetween.

The p-type semiconductor layer 300 is formed by doping boron (B) into an amorphous silicon ("a-Si") layer (not shown) to increase a number of holes therein. The p-type semiconductor layer 300 has a thickness W1. In an exemplary embodiment, the thickness W1 has a range of approximately 200 angstroms to approximately 1000 angstroms.

The n-type semiconductor layer 400 is formed by doping phosphorus (P) into an amorphous silicon layer to increase a number of electrons therein. The n-type semiconductor layer 400 has a thickness W2 which has a range of approximately 200 angstroms to approximately 1000 angstroms.

In an exemplary embodiment, the p-type semiconductor layer 300 has a band gap energy greater than a band gap energy of the intrinsic semiconductor layer 200a, thereby causing a photoelectric conversion reaction in the intrinsic semiconductor layer 200a without loss of energy of the light to the photodiode 500a. The p-type semiconductor layer 300 may further include hydride or carbon to ensure that the band gap energy of the p-type semiconductor layer 300 is greater than the band gap energy of the intrinsic semiconductor layer 200a.

Still referring to FIG. 1, the intrinsic semiconductor layer 200a includes an amorphous silicon layer 160 and a crystalline silicon layer 100. In an exemplary embodiment, the crystalline silicon layer 100 includes a polycrystalline silicon layer in which each crystal has a diameter equal to or less than approximately 100 angstroms. The crystalline silicon layer 100 will be described in further detail below with reference to FIG. 2.

In an exemplary embodiment, the amorphous silicon layer 160 has a light energy absorptivity greater by approximately three times a light energy absorptivity of the crystalline silicon layer 100, since the amorphous silicon layer 160 does not have a crystalline surface (as the crystalline silicon layer 100 does). More specifically, the crystalline silicon layer 100 has a crystalline surface and light is reflected from the crystalline surface, and the light energy absorptivity of the crystalline silicon layer 100 is thereby lower than the light energy absorptivity of the amorphous silicon layer 100. However, the crystalline silicon layer 100 has a photoelectric conversion efficiency greater by approximately eight times to approximately nine times that of the amorphous silicon layer 160.

In an exemplary embodiment, the amorphous silicon layer 160 has a thickness W3 which is equal to or less than approximately 1 micrometer, to effectively prevent the amorphous silicon layer 160 from absorbing light, as may happen when the amorphous silicon layer 160 has a thickness greater than approximately 1 micrometer. However, although the amorphous silicon layer 160 has the thickness W3 greater than approximately 1 micrometer and thereby does not absorb the light, a photoelectric conversion efficiency of the amorphous silicon layer 160 is not improved. Thus, in an alternative exemplary embodiment, the amorphous silicon layer 160 does not need to have a thickness which is greater than approximately 1 micrometer.

The intrinsic semiconductor layer 200a further includes holes and electrons, and a number of the holes is approximately equal to a number of the electrons. When light is applied to the intrinsic semiconductor layer 200a, silicon atoms in the intrinsic semiconductor layer 200a absorb energy form the light. As a result, a photoelectric conversion reaction occurs, in which an outermost electron of the silicon atoms is excited and becomes a free electron. After the free electron is generated, when biasing the photodiode 500a to allow the p-type silicon layer 300 and the n-type silicon layer 400 to have a negative polarity and a positive polarity, respectively, e.g., with a biasing voltage Vb, the free electron moves toward the n-type silicon layer 400.

A mechanism of the photoelectric conversion reaction caused by the intrinsic semiconductor layer 200a will now be described in further detail with reference to FIG. 1. When a first light A1 is irradiated onto the amorphous silicon layer 160, the amorphous silicon layer 160 absorbs energy of the first light A1 and causes a first photoelectric conversion reaction of the first light A1 which generates the free electrons. The crystalline silicon layer 100 causes a second photoelectric conversion reaction of a second light A2 not absorbed by the amorphous silicon layer 160 and advancing toward the crystalline silicon layer 100 to further generate free electrons. Also, the amorphous silicon layer 160 causes a third photoelectric conversion reaction of a third light A3 not absorbed by and reflected from the crystalline silicon layer 100 to further generate free electrons, as shown in FIG. 1.

Thus, the photodiode 500a causes the photoelectric conversion reaction in the crystalline silicon layer 100 using light which is not absorbed by the amorphous silicon layer 160 and thereby further causes the photoelectric conversion reaction in the amorphous silicon layer 160 using light which is reflected from the crystalline silicon layer 100. Thus, the photodiode 500a according to an exemplary embodiment of the present invention provides substantially improved photoelectric conversion efficiency as compared to a photodiode including, for example, an intrinsic silicon layer with a single-layer structure, such as an amorphous silicon layer or a crystalline silicon layer.

Figure 2:
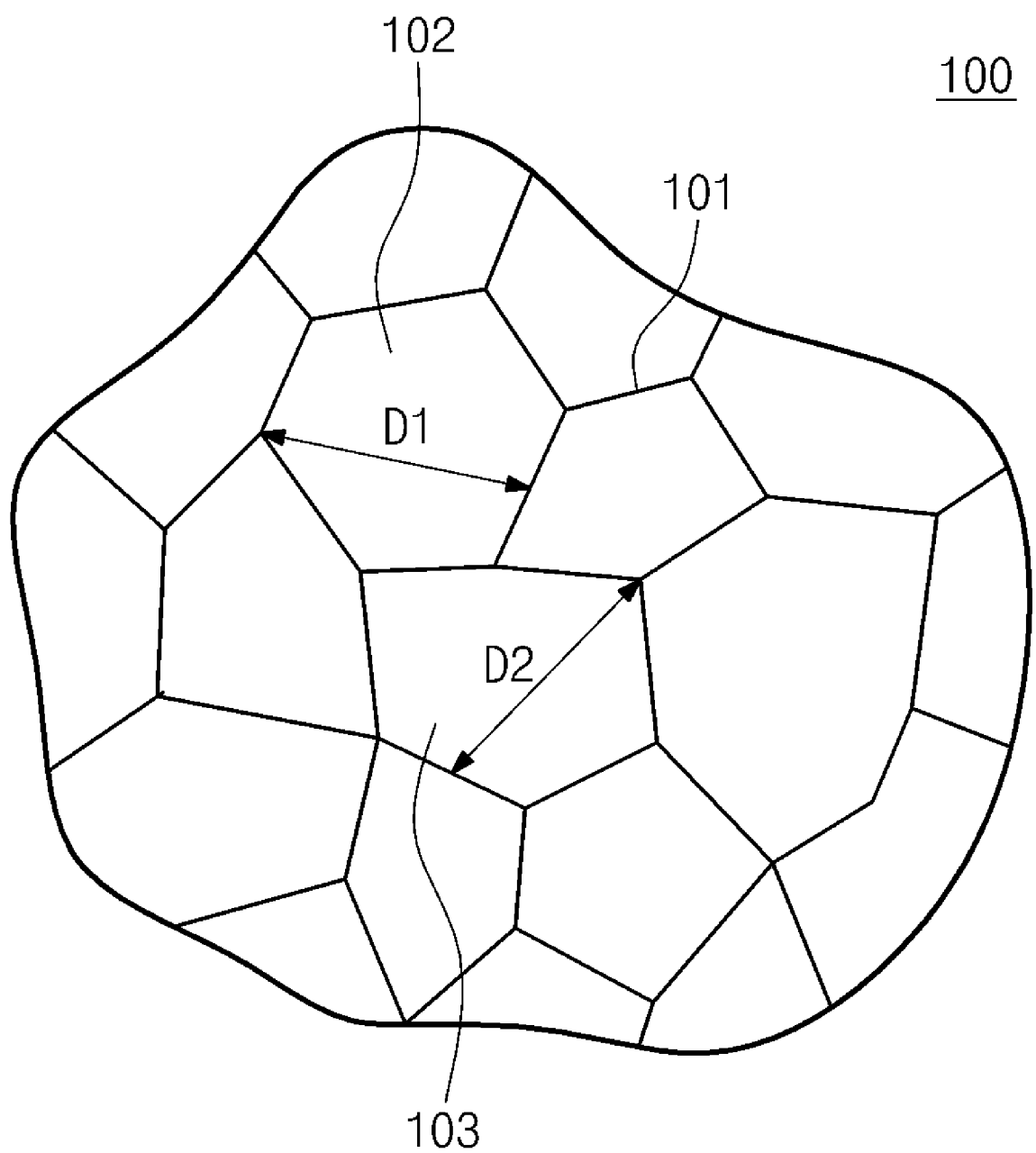
FIG. 2 is an enlarged view of a crystalline silicon layer of the photoelectric conversion device according to the exemplary embodiment of the present invention shown in FIG. 1.

FIG. 2 is an enlarged view of a crystalline silicon layer of the photoelectric conversion device according to the exemplary embodiment of the present invention shown in FIG. 1.

Referring to FIG. 2, the crystalline silicon layer 100 includes a plurality of crystals, and individual crystals of the plurality of crystals are separated from each other by a crystal boundary 101. The crystal boundary 101 is formed when individual crystals each having a different axis make contact with each other, and the crystal boundary 101 separates crystals substantially adjacent to each other, as shown in FIG. 2.

More specifically, as shown in FIG. 2, a first silicon crystal 102 and a second silicon crystal 103 have substantially the same crystal lattice. However, the first silicon crystal 102 has a different crystal axis than a crystal axis of the second silicon crystal 103.

As described above, each of the crystals of the crystalline silicon layer 100 has a diameter equal to or less than approximately 100 angstroms. For example, the first silicon crystal 102 and the second silicon crystal 103 have a first diameter D1 and a second diameter D2, respectively, which are both equal to or less than approximately 100 angstroms. In an exemplary embodiment, diameters of each crystal are adjusted by a temperature of a heat-treatment process applied when crystallizing the amorphous silicon layer.

Figure 3:
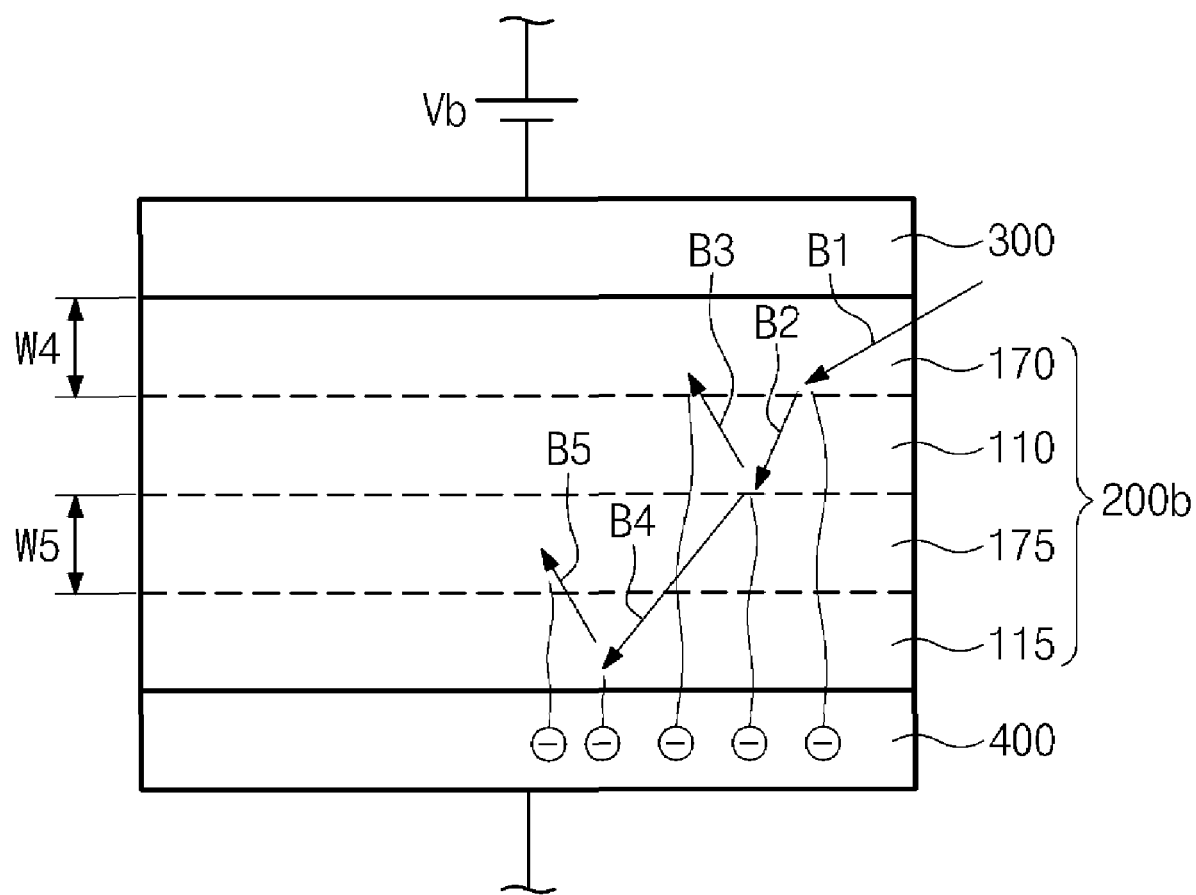
FIG. 3 is a partial cross-sectional equivalent schematic view of a photoelectric conversion device according to an alternative exemplary embodiment of the present invention.

FIG. 3 is a partial cross-sectional equivalent schematic view of a photoelectric conversion device according to an alternative exemplary embodiment of the present invention. In FIG. 3, the same reference numerals denote the same or like elements in FIGS. 1 and 2, and thus any repetitive descriptions of the same or like elements will hereinafter be omitted. Further, in an exemplary embodiment, the photoelectric conversion device is a photodiode, and thus the photodiode will be described herein as a representative photoelectric conversion device, but alternate exemplary embodiments of the present invention of the present invention are not limited thereto.

Referring to FIG. 3, a photodiode 500b includes an intrinsic semiconductor layer 200b, and the intrinsic semiconductor layer 200b includes a first amorphous silicon layer 170, a second amorphous silicon layer 175, a first crystalline silicon layer 110, and a second crystalline silicon layer 115. The first crystalline silicon layer 110 and the second crystalline silicon layer 115 each include a plurality of crystals each having a diameter equal to or less than approximately 100 angstroms, as was described above with respect to the crystalline silicon layer 100 shown in FIG. 2.

The first amorphous silicon layer 170 and the second amorphous silicon layer 175 have a thickness W4 and a thickness W5, respectively, and a sum of the thicknesses W4 and W5 of the first amorphous silicon layer 170 and the second amorphous silicon layer 175 is equal to or less than approximately 1 micrometer. Thus, the first amorphous silicon layer 170 and the second amorphous silicon layer 175 will not absorb light irradiated thereon, as would be the case if the sum of the thicknesses W4 and W5 of the first amorphous silicon layer 170 and the second amorphous silicon layer 175 were greater than approximately 1 micrometer.

Further, a sum of thicknesses of the first crystalline silicon layer 110 and the second crystalline silicon layer 115 may be equal to or different than the sum of the thicknesses W4 and W5 of the first amorphous silicon layer 170 and the second amorphous silicon layer 175. Thus, when adjusting the thicknesses of the first crystalline silicon layer 110 and the second crystalline silicon layer 115, as well as the thicknesses W4 and W5 of the first amorphous silicon layer 170 and the second amorphous silicon layer 175, an amount of electrons generated by photoelectric conversion in the first crystalline silicon layer 110 and the second crystalline silicon layer 115, as well as an amount of electrons generated by photoelectric conversion in the first amorphous silicon layer 170 and the second amorphous silicon layer 175 may be adjusted.

Hereinafter, a mechanism of the photoelectric conversion reaction caused by the intrinsic semiconductor layer 200b will be described in further detail with respect to FIG. 3.

When a first light B1 is irradiated onto the first amorphous silicon layer 170, the first amorphous silicon layer 170 absorbs energy of the first light B1 and causes a first photoelectric conversion reaction of the first light B1, thereby generating free electrons. The first crystalline silicon layer 110 causes a second photoelectric conversion reaction of a second light B2 not absorbed by the first amorphous silicon layer 170 and advancing toward the first crystalline silicon layer 110 to further generate free electrons. Likewise, the first amorphous silicon layer 170 causes a third photoelectric conversion reaction of a third light B3 reflected from the first crystalline silicon layer 110 to further generate free electrons.

Further, the second amorphous silicon layer 175 causes a fourth photoelectric conversion reaction of a fourth light B4 not absorbed by the first crystalline silicon layer 110 and advancing toward the second crystalline silicon layer 115, and the second crystalline silicon layer 115 absorbs a portion of the fourth light B4 to cause a fifth photoelectric conversion reaction of the portion of the fourth light B4 to further generate the free electrons. Also, the second amorphous silicon layer 175 absorbs a fifth light B5 reflected from the second crystalline silicon layer 115 and causes a sixth photoelectric conversion reaction of the fifth light B5 to further generate the free electrons.

Thus, the intrinsic semiconductor layer 200b of the photodiode 500b includes the first amorphous silicon layer 170, the second amorphous silicon layer 175, the first crystalline silicon layer 110, and the second crystalline silicon layer 115, as shown in FIG. 3, so that although light provided to respective amorphous and crystalline silicon layers is partially reflected from or transmitted through any one of the respective amorphous and crystalline silicon layers, other amorphous and crystalline layers adjacent to a respective single amorphous and/or crystalline silicon layer causes a photoelectric conversion reaction using the reflected and/or transmitted light. Accordingly, the photodiode 500b according to an exemplary embodiment has an increased number of free electrons generated by the photoelectric conversion reaction, thereby improving a photoelectric conversion efficiency of the photodiode 500b.

Figure 4:
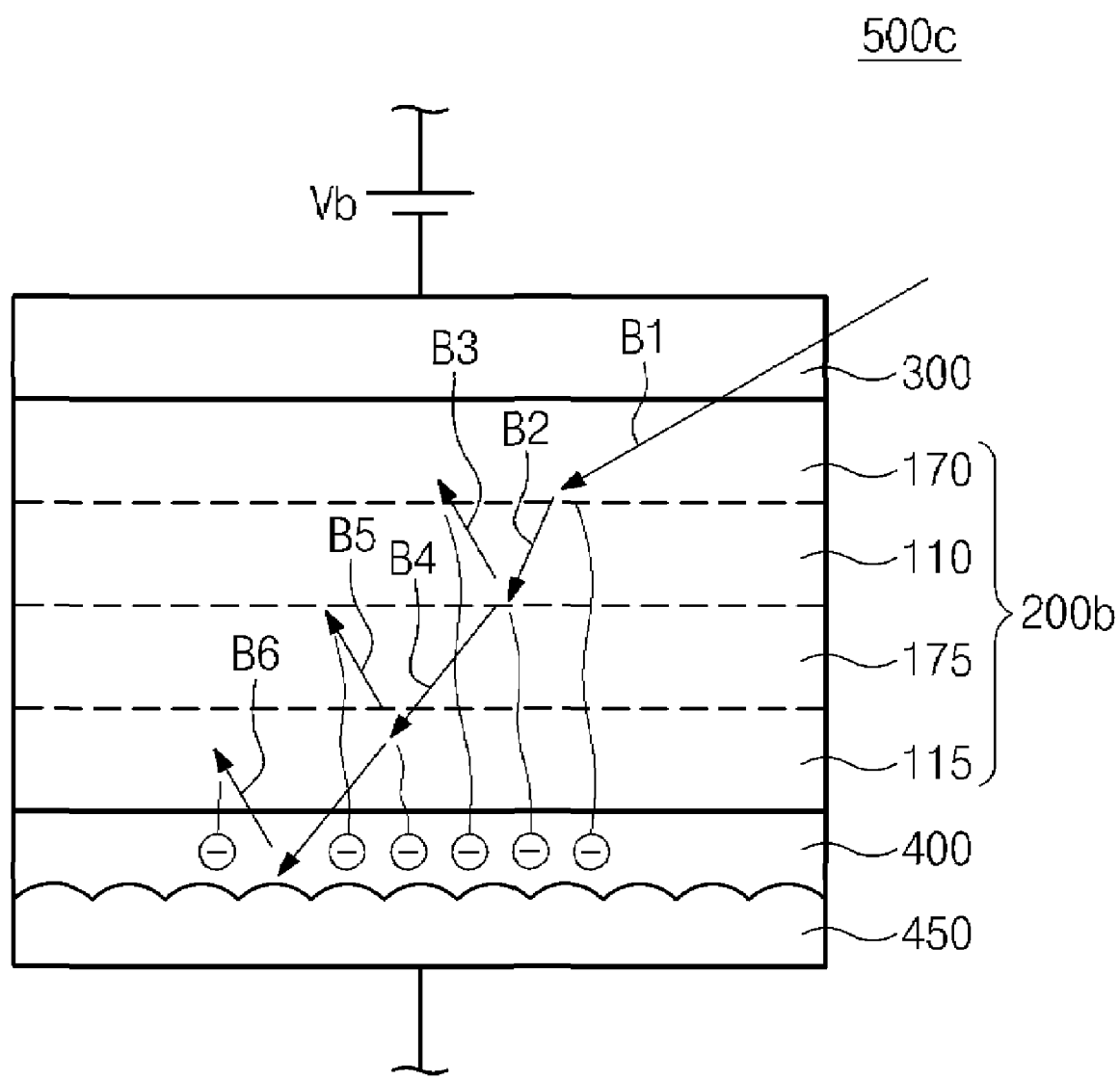
FIG. 4 is a partial cross-sectional equivalent schematic view of a photoelectric conversion device according to yet another alternative exemplary embodiment of the present invention.

FIG. 4 is a partial cross-sectional equivalent schematic view of a photoelectric conversion device according to yet another alternative exemplary embodiment of the present invention. In FIG. 4, the same reference numerals denote the same or like elements in FIG. 3, and thus any repetitive descriptions of the same or like elements will hereinafter be omitted. Further, in an exemplary embodiment, the photoelectric conversion device may be a photodiode, and thus, hereinafter, the photodiode will be described as a representative photoelectric conversion device, but alternative exemplary embodiments of the present invention are not limited thereto.

Referring to FIG. 4, a photodiode 500c includes substantially the same structures having substantially the same or like functions as those of the photodiode 500b (FIG. 3) except for a reflecting layer 450. Put another way, the photodiode 500c further includes the reflecting layer 450. The reflecting layer 450 substantially faces the second crystalline silicon layer 115 while including the n-type silicon layer 400 interposed therebetween, e.g., the n-type silicon layer 400 is disposed between the reflecting layer 450 and the second crystalline silicon layer 115, as shown in FIG. 4. In an exemplary embodiment, the reflecting layer 450 includes a metallic material which reflects light and further includes an embossing pattern formed on a surface thereof, e.g., formed on a surface of the reflecting layer 250 which substantially faces the n-type silicon layer 400.

The reflecting layer 450 reflects a sixth light B6 advancing to the n-type silicon layer 400 from the second crystalline silicon layer 115, and thus the second crystalline silicon layer 115 causes a photoelectric conversion reaction with the sixth light B6. Thus, in the intrinsic semiconductor layer 200b, additional photoelectric conversion is created by the sixth light B6 reflected from the reflecting layer 450 in addition to the photoelectric conversion caused by the first through fifth lights B1 through B5, respectively.

Figure 5:
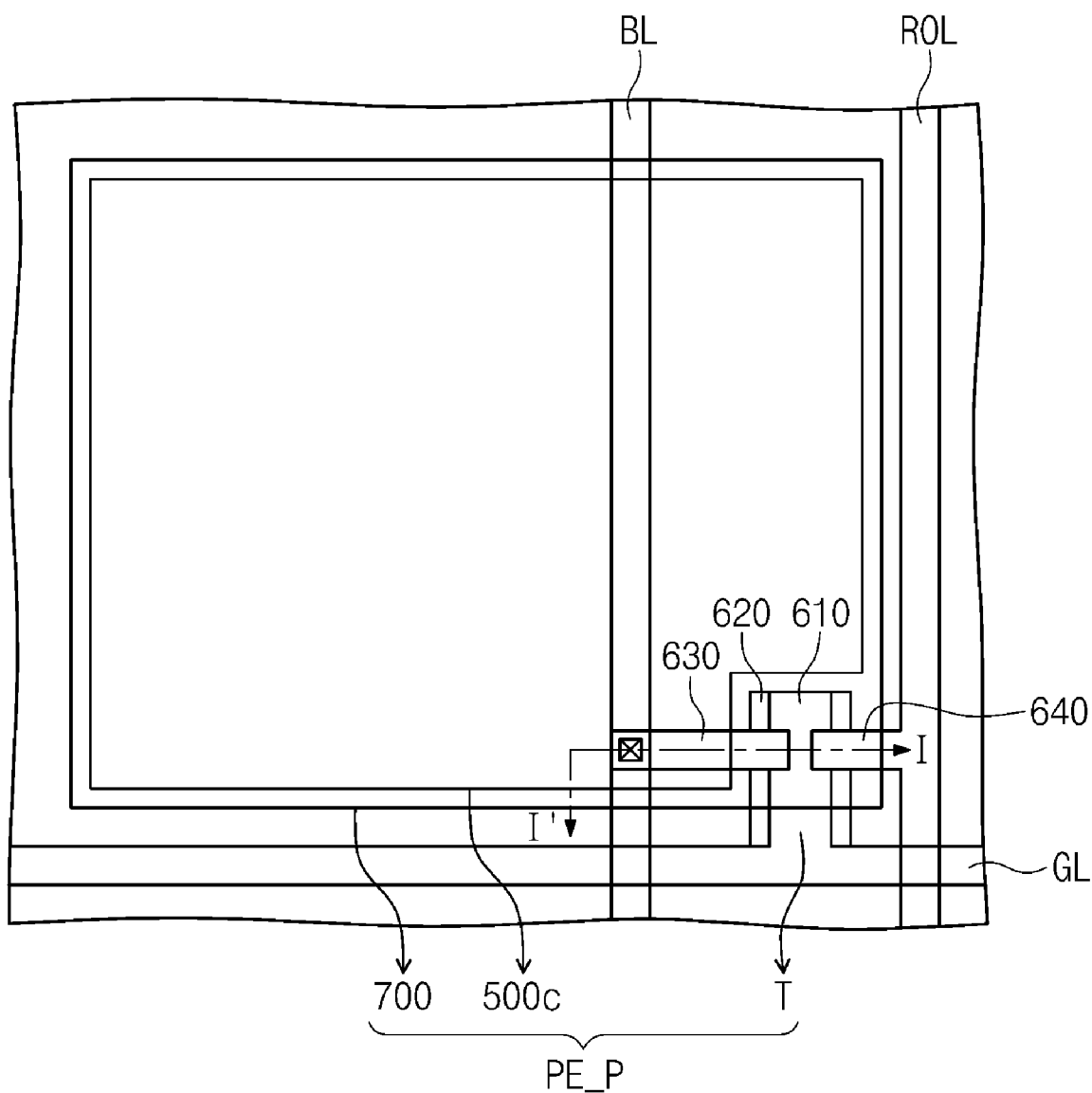
FIG. 5 is a plan view of a photodetector apparatus according to an exemplary embodiment of the present invention.

FIG. 5 is a plan view of a photodetector apparatus according to an exemplary embodiment the present invention. In FIG. 5, the same reference numerals denote the same or like elements in FIGS. 1 through 4, and thus any repetitive description of the same or like elements will hereinafter be omitted. Further, the photodetector apparatus according to an exemplary embodiment includes a plurality of photoelectric conversion parts for a photoelectric conversion reaction of light, but for purposes of illustration, only one photoelectric conversion part will be described with reference to FIG. 5, since the photoelectric conversion parts each have substantially the same or like structures and the same or like functions as other photoelectric conversion parts. It will be understood, however, that alternative exemplary embodiments of the present invention are not limited to one photoelectric conversion part.

Referring to FIG. 5, a photodetector apparatus 1000a according to an exemplary embodiment includes a plurality of photoelectric conversion parts PE_P, one of which is shown in FIG. 5, a read-out line ROL, a bias line BL, and a gate line GL. The photoelectric conversion part PE_P includes a scintillator 700, a thin film transistor ("TFT") T, and a photodiode 500c.

The scintillator 700 receives an x-ray, for example, and converts the x-ray into a light having a wavelength which corresponds to visible light to thereby emit a visible light. Accordingly, when an amount of energy from the x-ray which is irradiated onto the scintillator 700 varies based on a density of an external subject, an amount of the visible light emitted from the scintillator 700 also varies according to the amount of energy from the x-ray which is irradiated onto the scintillator 700 through the external object.

The photodiode 500c includes substantially the same structure and/or substantially the same functions as those described in greater detail above with reference to FIG. 4. The photodiode 500c is disposed substantially under the scintillator 700 (FIG. 6) and receives the visible light emitted from the scintillator 700 to thereby cause photoelectric conversion reactions using light energy of the visible light emitted from the scintillator 700. As a result, electrons are generated in the photodiode 500c and are charged in a first electrode 630 electrically connected to the photodiode 500c since the photodiode 500c is biased with a negative voltage, as described in greater detail above. Thus, when a gate signal is applied to a gate electrode 610 through the gate line GL, the electrons charged in the first electrode 630 are provided to the read-out line ROL through an active pattern 620 and a second electrode 640, as shown in FIG. 5.

Figure 6:
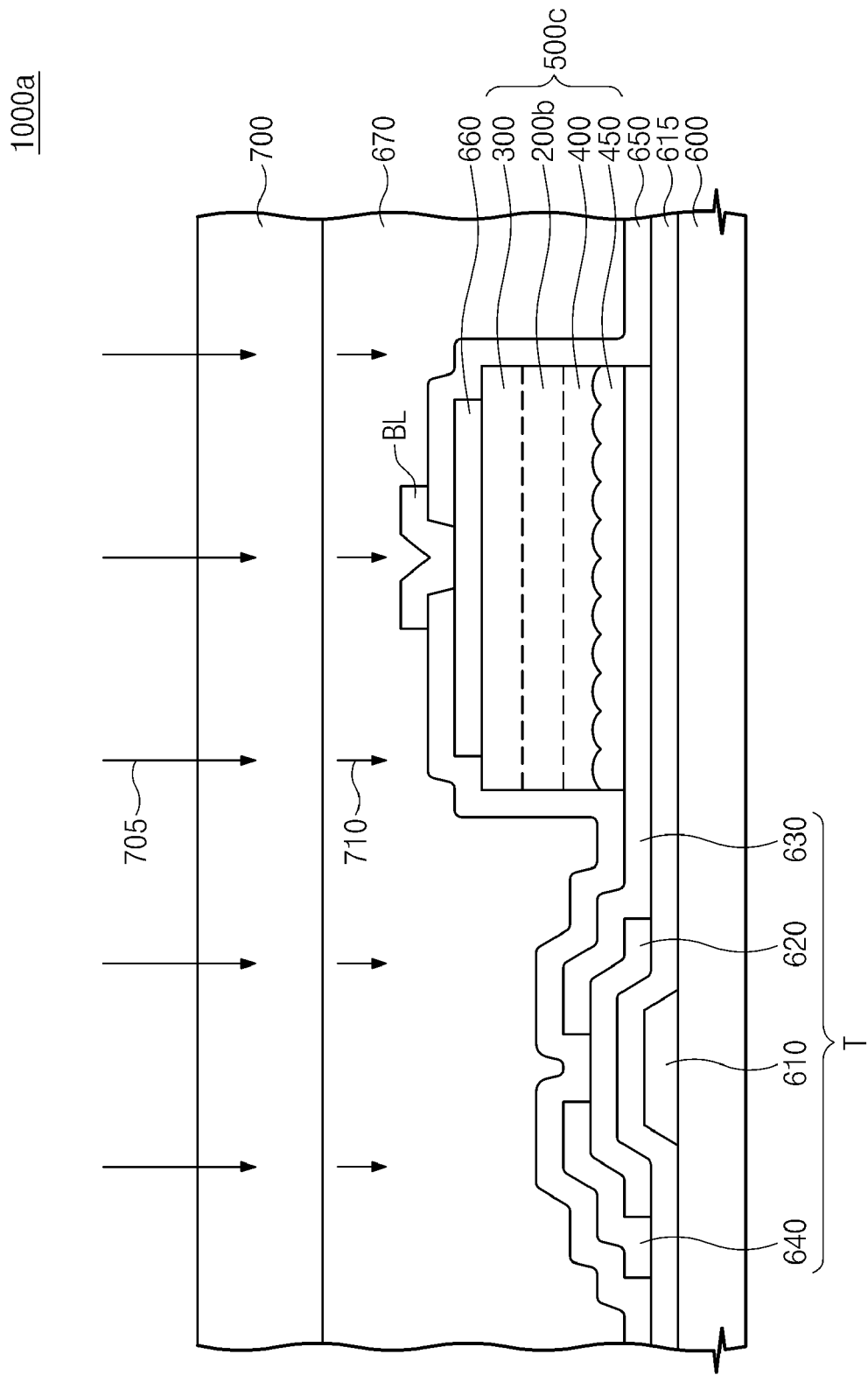
FIG. 6 is a partial cross-sectional view taken along line I-I' of FIG. 5.

FIG. 6 is a partial cross-sectional view taken along line I-I' of FIG. 5.

Referring to FIG. 6, the thin film transistor T is formed on a base substrate 600. The thin film transistor T includes the gate electrode 610 covered by a gate insulating layer 615, the active pattern 620 which overlaps the gate electrode 610, the first electrode 630 which overlaps a first end of the active pattern 620, and the second electrode 640 which overlaps a second end of the active pattern 620.

The photodiode 500c is formed on the base substrate 600 and positioned substantially adjacent to the thin film transistor T. The photodiode 500c further includes a transparent conductive layer 660 which serves as an upper electrode 660 and an inter-insulating layer 650. The inter-insulating layer 650 is formed over the base substrate 600 to cover the thin film transistor T and the photodiode 500c disposed thereunder. The inter-insulating layer 650 is partially removed to partially expose the upper electrode 660, so that the upper electrode 660 may be electrically connected to the bias line BL. Also, since the reflecting layer 450 is electrically connected to the first electrode 630, electrons generated in the photodiode 500c are provided to the read-out line ROL through the first electrode 630. The photodetector apparatus 1000a further includes an insulating layer 670 disposed under the scintillator 700.

As described in greater detail above, the photodiode 500c includes the intrinsic semiconductor layer 200b in which the first amorphous silicon layer 170, the second amorphous silicon layer 175, the first crystalline silicon layer 110, and the second crystalline silicon layer 115 are disposed, so that the photodiode 500c according to an exemplary embodiment has a substantially improved photoelectric conversion efficiency. Further, due to the improved photoelectric conversion efficiency of the photodiode 500c, the photodetector apparatus 1000a (refer to FIG. 5) also has improved photodetecting efficiency. In an exemplary embodiment, the photodetector apparatus 1000a further includes a display apparatus (not shown) which displays images in response to signals from the photodetector apparatus 1000a, and a contrast ratio of the imaged displayed on the display apparatus is also improved due to the improved photoelectric conversion efficiency and/or the improved photodetecting efficiency.

Hereinafter, an operation of the photodetecting apparatus 1000a using photoelectric conversion reactions will be described in further detail with reference to FIG. 6.

When an x-ray 705 is irradiated onto the scintillator 700, the x-ray 705 is converted by the scintillator 700 into light 710 having a wavelength corresponding to visible light, and the light 710 is applied to the photodiode 500c. The intrinsic silicon semiconductor 200b absorbs light energy of the light which is irradiated onto the photodiode 500c from the scintillator 700 and causes a photoelectric conversion reaction, thereby generating electrons and holes in the intrinsic semiconductor layer 200b.

The photodiode 500c is biased to the negative voltage by a biasing voltage Vb (FIG. 4) applied through the bias line BL to guide the electrons to the n-type silicon layer 400, and thus the electrons move to the first electrode 630 which is electrically connected to the n-type silicon layer 400 through the reflecting layer 450. When a gate signal is applied to the gate electrode 610, the electrons in the first electrode 630 are provided to the read-out line ROL through the active pattern 620 and the second electrode 640.

Figure 7:
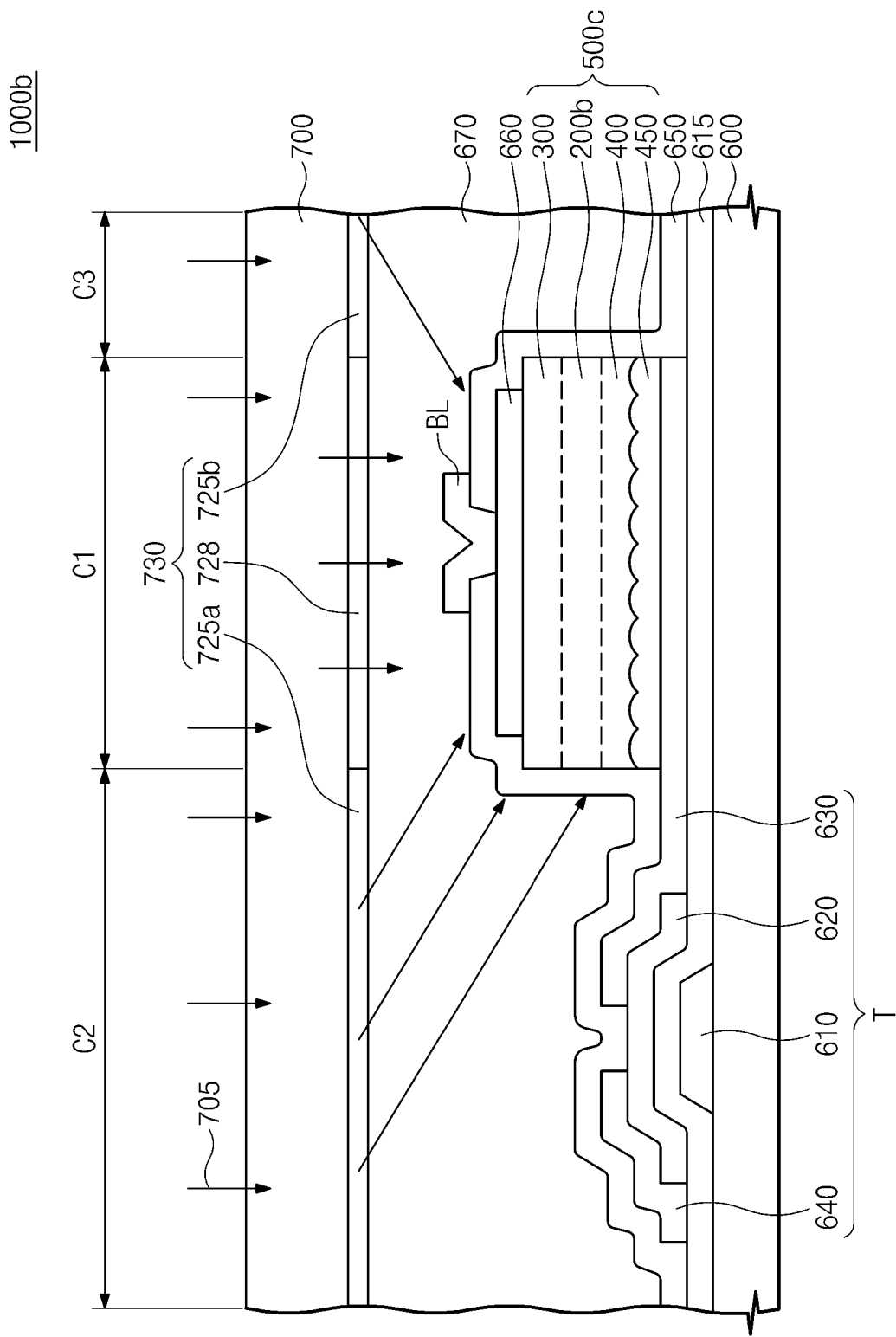
FIG. 7 is a partial cross-sectional view of a photodetector apparatus according to an alternative exemplary embodiment of the present invention.

FIG. 7 is a partial cross-sectional view of a photodetector apparatus according to an alternative exemplary embodiment of the present invention. In FIG. 7, the same reference numerals denote the same or like elements in FIG. 6, and thus any repetitive description of the same or like elements will hereinafter be omitted.

Referring to FIG. 7, a photodetector apparatus 1000b includes substantially the same or like configuration and substantially the same functions as the photodetector apparatus 1000a in FIG. 6. The photodetector apparatus 1000b further includes a light guide film 730 disposed substantially between the scintillator 700 and the insulating layer 670.

The light guide film 730 includes a first light guide portion 728 corresponding to a first region C1, a second light guide portion 725a corresponding to a second region C2, and a third light guide portion 725b corresponding to a third region C3. More specifically, when viewed in a plan view similar to as shown in FIG. 5, the first region C1 overlaps a region in which the photodiode 500c is formed, while the second region C2 and the third region C3 do not overlap the region in which the photodiode 500c is formed. In addition, the second region C2 and the third region C3 are separated from each other by the first region C1.

In an exemplary embodiment, the first light guide portion 728, the second light guide portion 725a, and the third light guide portion 725b include different materials, so that lights transmitted through first light guide portion 728, the second light guide portion 725a, and the third light guide portion 725b advance in different respective direction.

More specifically, the first light guide portion 728 includes a transparent material, and light emitted from the scintillator 700 and advancing in a direction substantially perpendicular to the base substrate 600 is irradiated onto the photodiode 500c without variation of a direction in which light advances after transmitting through the first light guide portion 728. However, the second light guide portion 725a and the third light guide portion 725b include a transparent material having a refractive index greater than that of the first light guide portion 728, and light emitted from the scintillator 700 and advancing toward the second third region C2 and the third region C3 is thereby refracted by the second light guide portion 725a and the third light guide portion 725b, so that the light advancing toward the second region C2 and the third region C3 are irradiated onto the photodiode 500c.

Thus, an amount of light applied to the photodiode 500c is thereby increased, and a photoelectric conversion efficiency of the photodiode 500c is substantially improved, thereby improving a photodetecting efficiency of the photodetector apparatus 1000b according to an exemplary embodiment.

FIG. 8 is a partial cross-sectional view of a photodetector apparatus according to still another alternative exemplary embodiment of the present invention. In FIG. 8, the same reference numerals denote the same or like elements as in FIG. 7, and thus any repetitive descriptions of the same elements will hereinafter be omitted.

Referring to FIG. 8, a photodetector apparatus 1000c includes the scintillator 700, on which a plurality of light tubes 708 are formed, a semi-transmission plate 740, and an insulating layer 675 on which an embossing pattern 678 is formed.

Light tubes 708 of the plurality of light tubes 708 are formed on a lower surface of the scintillator 700, e.g., a surface of the scintillator 700 which faces the insulating layer 675, as shown in FIG. 8. The light tubes 708 are disposed substantially apart from each other by a predetermined uniform distance, and each light tube 708 has a substantially cylindrical shape, as shown in FIG. 8. Accordingly, the light tubes 708 allow light emitted from the scintillator 700 to advance in a direction substantially perpendicular to a plane of the base substrate 600.

The semi-transmission plate 740 is disposed substantially under the light tubes 708 and is positioned substantially parallel to the plane of base substrate 600. In an exemplary embodiment, the semi-transmission plate 740 is an acryl-containing organic layer, but alternative exemplary embodiments are not limited thereto. The semi-transmission plate 740 reflects light incident thereon at a predetermined inclination angle while maintaining a substantially constant advancing direction of the light incident thereon in a direction substantially perpendicular to the semi-transmission plate 740.

In an exemplary embodiment, the embossing pattern 678 is formed on the insulating layer 675 corresponding to the second region C2 and the third region C3. The embossing pattern

678 may be formed by forming protrusions on the insulating layer 675 and heat-treating the insulating layer 675, for example.

In operation, the photodetector apparatus 1000*c* including the semi-transmission plate 740 and the insulating layer 675 on which the embossing part 678 is formed, lights 718 advancing toward the second region C2 and the third region C3 are reflected several times by the embossing pattern 678 and the semi-transmission plate 740, to thereby guide the lights 718 to the photodiode 500*c*. As a result, an amount of the light applied to the photodiode 500*c* is substantially increased, and a photoelectric conversion efficiency of the photodiode 500*c* is thereby improved, improving a photodetecting efficiency of the photodetector apparatus 1000*c* according to an exemplary embodiment.

As described herein, a photoelectric conversion device according to an exemplary embodiment of the present invention includes an n-type silicon layer, a p-type silicon layer, and an intrinsic silicon layer. The intrinsic silicon layer includes an amorphous silicon layer and a crystalline silicon layer including crystals having diameters equal to or less than approximately 100 angstroms.

Thus, according to exemplary embodiments of the present invention, photoelectric conversion reactions in the photoelectric conversion device occur in both the amorphous silicon layer having a superior light energy absorptivity and the crystalline silicon layer having a superior electron mobility, and a photoelectric conversion efficiency is thereby substantially improved. As a result, a photodetecting efficiency of the photodetector apparatus having the above-mentioned photoelectric conversion device is substantially improved.

The present invention should not be construed as being limited to the exemplary embodiments set forth herein. Rather, these exemplary embodiments are provided so that this disclosure will be thorough and complete and will fully convey the concept of the present invention to those skilled in the art.

Thus, while the present invention has been particularly shown and described with reference to exemplary embodiments thereof, it will be understood by those of ordinary skill in the art that various changes in form and details may be made therein without departing from the spirit or scope of the present invention as defined by the following claims.

What is claimed is:

1. A photoelectric conversion device comprising:
    an intrinsic semiconductor layer comprising:
        at least one of an amorphous semiconductor layer; and
        at least one of crystalline semiconductor layer including a plurality of crystals;
    a first conductive type semiconductor layer disposed on a first side of the intrinsic semiconductor layer; and
    a second conductive type semiconductor layer disposed on a second side of the intrinsic semiconductor layer opposite the first side.

2. The photoelectric conversion device of claim 1, wherein a thickness of the amorphous semiconductor layer is equal to or less than approximately 1 micrometer.

3. The photoelectric conversion device of claim 1, wherein the first conductive type semiconductor layer comprises a p-type semiconductor layer, and
    the second conductive type semiconductor layer comprises an n-type semiconductor layer.

4. The photoelectric conversion device of claim 3, wherein the amorphous semiconductor layer and the crystalline semiconductor layer are disposed directly on each other, and
    the first conductive type semiconductor layer and the amorphous semiconductor layer are disposed directly on each other.

5. The photoelectric conversion device of claim 3, wherein a band gap energy of the first conductive type semiconductor layer is greater than a band gap energy of the intrinsic semiconductor layer.

6. The photoelectric conversion device of claim 1, wherein the first conductive type semiconductor layer, the second conductive type semiconductor layer and the intrinsic semiconductor layer comprise silicon.

7. The photoelectric conversion device of claim 1, wherein a thickness of the first conductive type semiconductor layer has a range of approximately 200 angstroms to approximately 1000 angstroms.

8. The photoelectric conversion device of claim 3, further comprising a reflecting layer which faces the intrinsic semiconductor layer,
    wherein the second conductive type semiconductor layer is disposed between the intrinsic semiconductor layer and the reflecting layer.

9. The photoelectric conversion device of claim 8, wherein the reflecting layer comprises an embossing pattern formed on a surface which faces the intrinsic semiconductor layer.

10. The photoelectric conversion device of claim 1, wherein a thickness of the amorphous semiconductor layer is not equal to a thickness of the crystalline semiconductor layer.

11. A photodetector apparatus comprising:
    a base substrate;
    a photoelectric conversion device disposed on the base substrate and comprising:
        an intrinsic semiconductor layer comprising:
            at least one of an amorphous semiconductor layer; and
            at least one of a crystalline semiconductor layer including a plurality of crystals;
        a first conductive type semiconductor layer disposed on a first surface of the intrinsic semiconductor layer; and
        a second conductive type semiconductor layer disposed on a second opposite surface of the intrinsic semiconductor layer;
    a bias line disposed on the base substrate and electrically connected to the photoelectric conversion device to apply a bias signal to the photoelectric conversion device; and
    a signal line disposed on the base substrate to output a current from the photoelectric conversion device,
    wherein the photoelectric conversion device receives a light from an external source,
    the light causes a photoelectric conversion reaction in the photoelectric conversion device, and
        the photoelectric conversion device outputs the current based on the photoelectric conversion reaction and the bias signal.

12. The photodetector apparatus of claim 11, further comprising a fluorescent member disposed on the photoelectric conversion device to convert the light applied to the photoelectric conversion device from the external source into a visible light.

13. The photodetector apparatus of claim 11, wherein a thickness of the amorphous semiconductor layer is equal to or less than approximately 1 micrometer.

14. The photodetector apparatus of claim 11, wherein the first conductive type semiconductor layer comprises a p-type semiconductor layer, and the second conductive type semiconductor layer comprises an n-type semiconductor layer.

15. The photodetector apparatus of claim 11, wherein a thickness of the first conductive type semiconductor layer has a range of approximately 200 angstroms to approximately 1000 angstroms.

16. The photodetector apparatus of claim 14, wherein a band gap energy of the first conductive type semiconductor layer is greater than a band gap energy of the intrinsic semiconductor layer.

17. The photodetector apparatus of claim 11, wherein the first conductive type semiconductor layer, the second conductive type semiconductor layer and the intrinsic semiconductor layer comprise silicon.

18. The photodetector apparatus of claim 14, wherein
the photoelectric conversion device further comprises a reflecting layer which faces the intrinsic semiconductor layer, and
the second conductive type semiconductor layer is disposed between the intrinsic semiconductor layer and the reflecting layer.

19. The photodetector apparatus of claim 18, wherein the reflecting layer comprises an embossing pattern formed on a surface which faces the intrinsic semiconductor layer.

20. The photodetector apparatus of claim 11, wherein a thickness of the amorphous semiconductor layer is not equal to a thickness of the crystalline semiconductor layer.

21. The photodetector apparatus of claim 11, further comprising a thin film transistor disposed on the base substrate and electrically connected to one of the first conductive type semiconductor layer and the second conductive type semiconductor layer to provide the current from the photoelectric conversion device to the signal line.

22. The photodetector apparatus of claim 14, wherein
the amorphous semiconductor layer and the crystalline semiconductor layer are disposed directly on each other, and
the first conductive type semiconductor layer and the amorphous semiconductor layer are disposed directly on each other.

23. The photoelectric conversion device of claim 1, wherein a diameter of a crystal of the plurality of crystals is equal to or less than approximately 100 angstroms.

24. The photodetector apparatus of claim 11, wherein each crystal of the plurality of crystals has a diameter equal to or less than approximately 100 angstroms.

* * * * *